United States Patent [19]

Baier et al.

[11] Patent Number: 4,852,804

[45] Date of Patent: Aug. 1, 1989

[54] MACHINE FOR TREATING OBJECTS WITH A TREATING LIQUID

[75] Inventors: Dietfried Baier, Herrenberg; Ivan Grasa, Gäufelden; Rainer Haas, Herrenberg, all of Fed. Rep. of Germany

[73] Assignee: Hans Hollmuller Maschinenbau GmbH & Co, Herrenberg, Fed. Rep. of Germany

[21] Appl. No.: 193,054

[22] Filed: May 12, 1988

[30] Foreign Application Priority Data

Mar. 5, 1988 [DE] Fed. Rep. of Germany ....... 3807262

[51] Int. Cl.[4] .......................... B05B 1/28; B05B 15/06
[52] U.S. Cl. ...................... 239/121; 134/59; 239/566; 239/579; 239/600
[58] Field of Search ............... 239/263.1, 263.3, 556, 239/566, 579, 600, 121; 134/59, 104, 144, 145, 172, 180, 181

[56] References Cited

U.S. PATENT DOCUMENTS

| 2,031,816 | 2/1936 | Blakeslee | 134/180 X |
| 3,468,320 | 9/1969 | Cumming | 239/600 X |
| 4,257,559 | 3/1981 | Noren | 239/600 X |
| 4,657,188 | 4/1987 | Crane et al. | 239/600 X |

FOREIGN PATENT DOCUMENTS 3345124 6/1985 Fed. Rep. of Germany ...... 134/144

Primary Examiner—Philip R. Coe
Attorney, Agent, or Firm—Fred Philpitt

[57] ABSTRACT

A machine for treating objects with a treatment liquid, in particular with an etching medium, comprises a nozzle assembly, which is able to move to and fro in the manner of a drawer between a working position within the housing and a maintenance position outside the housing. In the maintenance position, nozzles located on the nozzle assembly are easily accessible for cleaning, for alignment or for being exchanged. A plug-in coupling, by which the nozzle assembly is supplied with the treatment liquid, is automatically detached when the nozzle assembly is moved out and re-closes when the nozzle assembly is guided back into its working position.

14 Claims, 4 Drawing Sheets

MACHINE FOR TREATING OBJECTS WITH A TREATING LIQUID

The invention relates to a machine for treating objects with a treatment liquid, in particular an etching medium, with (a) a housing;
(b) at least one nozzle assembly, on which a plurality of nozzles is located, from which the treatment liquid is sprayed onto the objects.

In known machines of this type, such as are used in particular as etching, developing and rinsing machines in the production of plates for electronic circuits, the nozzle assembly is mounted in a fixed manner within the housing or may carry out solely an oscillating movement with respect thereto. With the high demands, which are made increasingly as regards the precision of the etching process, it is necessary to achieve a spray pattern which is defined very exactly. For this purpose, it must be guaranteed that each nozzle in fact delivers the intended quantity of treatment liquid per unit time, and in particular is not blocked and—when using fan-shaped nozzles—also retains a pre-determined angular position. Therefore, in order to guarantee these prerequisites, in machines of the afore-mentioned type, in part extensive adjustment and maintenance work on the nozzles is necessary. However, this is only possible with difficulties in the known machines, on account of the poor accessibility to the individual nozzles, especially since the inside of the housing may contain aggressive residues of the treatment liquid which are detrimental to health or have an offensive smell.

Therefore, in the machine of the afore-mentioned type described in German OS No. 33 45 124, the nozzle assembly as a whole was constructed as a plate, by which the actual treatment area, in which the treatment liquid is exclusively located, is divided from a maintenance area. In this case, the nozzles must be guided through the plate-like nozzle assembly, so that they can be aligned from the rear side of the nozzle assembly and if necessary can also be removed. This method of construction is comparatively expensive. In addition, when the nozzle assembly is intended to carry out an oscillating movement, problems occur with the seal with respect to the housing. Moreover, with this principle, a practicable solution for a nozzle assembly located in the lower region of the machine is only possible with difficulty.

It is the object of the present invention to construct a machine of the afore-mentioned type so that the individual nozzles on the nozzle assembly are easily accessible and thus are adjustable in their angular position and if necessary can be removed.

This object is achieved according to the invention due to the fact that (c) the nozzle assembly can be withdrawn in the manner of a drawer from a working position within the housing through a lateral opening of the housing, which can be closed off, into a maintenance position, in which it projects laterally from the housing and the nozzles are easily accessible;
(d) plug-in coupling members are provided, by which the nozzle assembly is supplied with treatment liquid and which are automatically disconnected when the nozzle assembly is withdrawn from the housing and automatically close when the nozzle assembly is pushed into the housing.

Thus, according to the invention, the nozzle assembly as a whole may be withdrawn completely from the housing of the machine, so that the individual nozzles are freely accessible. It is no longer necessary for the hands to enter the inside of the housing in the case of corresponding assembly, adjustment or other maintenance work, where, as mentioned, residues of the treatment liquid or their vapours may be present. After carrying out the necessary work on the nozzle assembly, the latter is returned to its working position; the connection to the source of treatment liquid is thus automatically re-established by the plug-in coupling members.

Advantageously, a locking device is provided, by which the nozzle assembly can be fixed in its working position pushed into the housing. This measure is necessary in particular where the nozzle assembly must carry out an oscillating movement in its working position, in order that no accidental lateral displacement of the nozzle assembly occurs and the plug-in coupling is accidentally disconnected. Moreover, the internal pressure, which attempts to separate the coupling members, is counteracted.

According to a particular feature of the invention, the lateral opening of the housing can be closed off by a side wall, which can be folded down into a horizontal position about an axis extending parallel to the conveying direction in the lower region of the housing, in which position it serves as a collecting tray for treatment liquid which drips from the nozzle assembly located in its maintenance position. The treatment liquid collected in the side wall may then be returned to the liquid sump, most simply when the side wall is folded back into its vertical position.

The lateral displaceability of the nozzle assembly provided according to the invention provides a particularly stable, mechanical construction. In known nozzle assemblies, which were produced exclusively from plastics material, without such mobility, a considerable deformation occurred in the course of time. It is therefore recommended that the nozzle assembly comprises a metal frame which has torsional rigidity, by which frame the nozzles are held.

In a particularly advantageous construction, the metal frame comprises on two opposite sides, two support bars extending parallel to each other with a vertical spacing, the two pairs of support bars being connected to each other at their ends by connecting struts.

The nozzles may in this case be supplied in parallel rows respectively by way of a common pipe, whereof the ends are held on the two pairs of support bars.

In this case, it is particularly appropriate if the opposite ends of the pipes are held by sleeves, which are slid onto the support bars. This method of construction allows particularly high flexibility in the arrangement of the nozzles on the nozzle assembly.

Tubular spacer members may be located between the sleeves on the support bars. These spacer members then determine the spacing between the individual rows of nozzles.

The attachment of the metal frame, which is part of the nozzle assembly, to the housing appropriately takes place so that projecting sliding members are attached at opposite sides, which sliding members are able to slide in a longitudinal slot in a rail, which is in turn held in the housing so that it is able to slide. In this way, the nozzle assembly can be withdrawn in a double telescopic manner, in which case first of all a displacement of the nozzle assembly with respect to the rail and then a displacement of the rail with respect to the housing takes place.

As already mentioned, in many machines of the aforementioned type, the nozzle assembly carries out an oscillating movement in its working position. In this case it is recommended that the nozzle assembly is fastened in a support frame, which carries out the oscillating movement and is able to slide laterally with respect to the latter, in the manner of a drawer, between its working position and its maintenance position.

In this case, those plug-in coupling members, which remain in place when the nozzle assembly is moved out into the maintenance position, can be attached to the support frame and connected by way of flexible pressure hoses to the pump for the treatment liquid. In this way, the plug-in coupling members remaining in the housing may carry out the oscillating movement jointly with the support frame, in which case the connection to the pump for the treatment liquid is maintained due to the flexibility of the pressure hoses provided according to the invention.

According to a further feature of the invention, in side view, the support frame has the shape of a horizontal U with two horizontal legs and a vertical connecting leg, in which case a nozzle assembly can be slidably fastened in each case to the horizontal legs. This embodiment is recommended for most machines used in practice, in which the material to be etched is to be sprayed from above and from below in each case by way of a nozzle assembly.

In this case, the horizontal legs of the support frame may be guided by two pairs of rollers attached to the housing. This ensures the easy action of the support frame during the oscillating movement.

Furthermore, it is advantageous if in plan view, the support frame has the shape of a horizontal U, the opening of the U pointing in the direction in which the nozzle assembly is moved out of the housing.

One embodiment of the invention will be described in detail hereafter with reference to the drawings, in which:

FIG. 1 is a partial section on line I—I of FIG. 2 through an etching machine, seen in the conveying direction, with the nozzle assembly pushed in;

Figure 1:
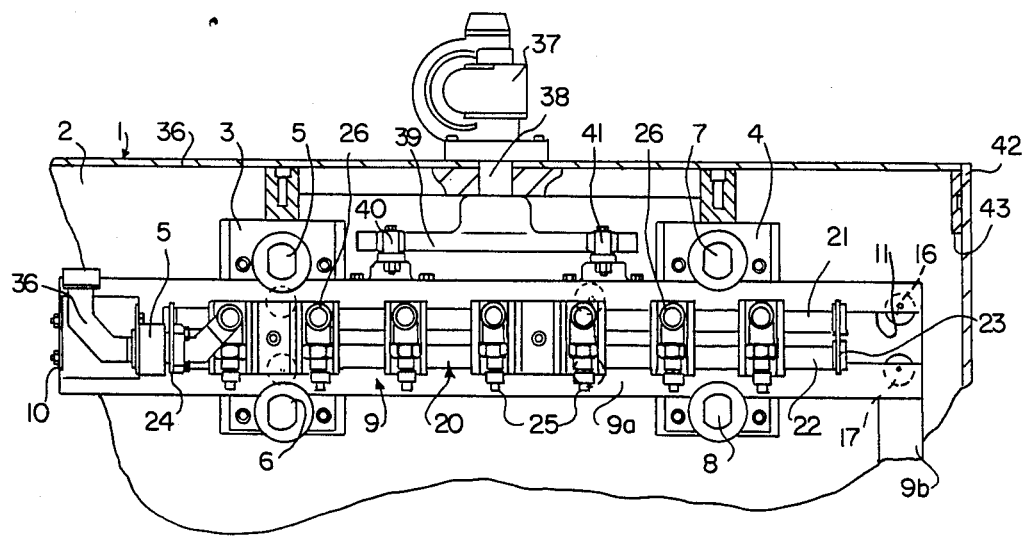

FIG. 1 is a vertical partial section through the upper region of an etching machine, seen in its conveying direction. Two bearing blocks 3, 4 are screwed to the side wall 2 of the housing 1 or a corresponding frame part, which is at the rear in the conveying direction. On each bearing block 3, 4, two pairs of rollers 5, 6 respectively 7, 8 are held in a rotary manner with a vertical spacing. The pairs of rollers 5, 6 respectively 7, 8 guide a support frame 9 able to move in the horizontal direction, which in the manner of a horizontal U is formed by an upper horizontal leg 9a, a vertical connecting leg 9b shown on the right in the drawing and a lower horizontal leg not shown in the drawing. The conditions in the region of the lower horizontal leg of the support frame 9 correspond completely to those in the illustrated upper region, so that it is possible to dispense with an explanation relating to this. The arrangement is clearly such that the entire support frame 9 with its two horizontal legs 9a and the connecting leg 9b can be moved towards the left and right in the view of FIGS. 1 to 4. As will be described in more detail hereafter, this degree of freedom is necessary for carrying out an oscillating movement of the nozzle assembly.

A corresponding support frame 9 is constructed on the side wall or corresponding frame part of the etching machine which is not shown in the drawing and is located at the front in the conveying direction. A separate description relating to this can also be dispensed with.

The two support frames 9 are connected to each other by a strut 10 extending parallel to the conveying direction of the etching machine, so that also in plan view, the two support frames and the strut 10 have the shape of a horizontal U, which is open towards the right hand side.

Figure 3:
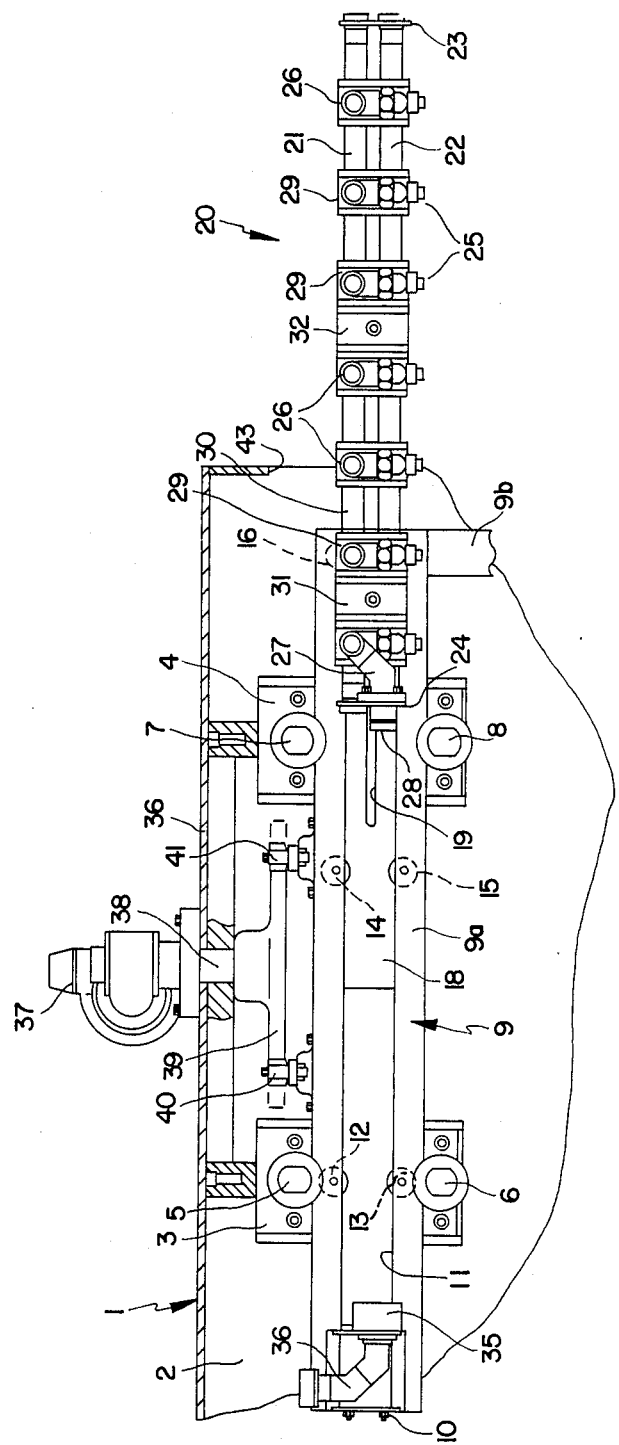
FIG. 3 is a partial section corresponding to FIG. 1, but with the nozzle assembly pulled out.

The horizontal legs 9a of the support frame 9 are respectively designed as sectional members with a longitudinal slot 11 opening towards the inside of the etching machine (see FIGS. 1 and 3). Six rollers 12 to 17 are mounted in the inside of the horizontal leg 9a, which rollers form three pairs of rollers. This can be seen particularly clearly in FIG. 3. Between the rollers 12 to 17, a rail 18 is guided to move in the horizontal direction, which rail is in the shape of a flat section placed on edge. Also the rail 18 extends within the cavity of the horizontal leg 9a of the support frame 9.

The rail 18 is in turn provided with a longitudinal slot 19 (see in particular FIG. 3), which serves for the movable mounting of a nozzle assembly, which is designated generally by the reference numeral 20.

The nozzle assembly 20 comprises a rigid retaining frame as the supporting member. At the front and rear side respectively in the conveying direction, this retaining frame comprises two parallel, horizontal support bars 21, 22 made of titanium and on the sides extending parallel to the conveying direction, respectively a connecting strut 23 or 24 of the same material. The retaining frame of the nozzle assembly 20 fixed by the support bars 21, 22 and the connecting struts 23, 24 is thus resistant to temperature and resistant to torsion so that no bending occurs even after a long operating time at higher temperatures.

A plurality of nozzles 25 is arranged in a regular pattern within the nozzle assembly 20. In the upper nozzle assembly 20 illustrated in the drawing, the nozzle aperture thus points respectively downwards onto the material to be etched moving at right angles to the plane of FIGS. 1 and 3, which in known manner is guided continuously through the etching machine by a conveying device which is not shown. In a corresponding manner, the etching nozzles on the lower nozzle assembly, which is not shown in the drawing, point upwards.

The nozzles 25 lying respectively in a row parallel to the conveying direction of the etching machine are connected to each other by way of a pipe 26 so that the etching medium is supplied to them collectively. Each pipe 26 is connected by way of a connecting pipe 27 extending at right angles to the conveying direction of the etching machine, to a plug-in coupling part 28, which is attached to the connecting strut 24 and by way of which the etching medium is supplied separately for each row of nozzles 25 located on a pipe 26 in a manner to be described hereafter. The plug-in coupling parts 28 can be seen particularly clearly in FIGS. 3 and 4.

The opposite ends of the pipes 26 carrying etching medium and consisting of synthetic material are held in sleeves 29, which are pushed over the support bars 21, 22 of the nozzle assembly 20. The sleeves 29 are kept at the correct spacing by tubular spacer members 30.

Figure 4:
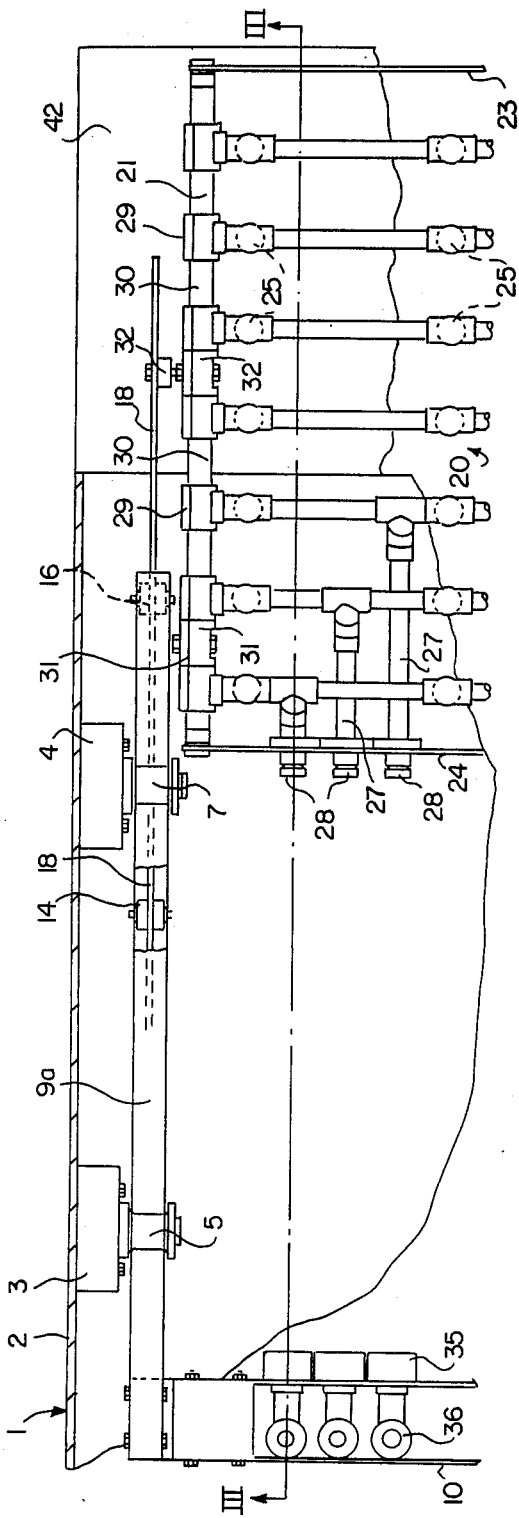
FIG. 4, is a plan view of the etching machine of FIG. 3, corresponding to FIG. 2, with the cover removed and the oscillation device removed.

At two points on the two opposite sides of the nozzle assembly 20, a spacer member is respectively replaced by a support sleeve 31, 32. Outwardly projecting sliding members 33, 34 of material having a low coefficient of friction are screwed to the support sleeves 31, 32, which sliding members 33, 34 engage in the longitudinal slot 19 in the rail 18, the arrangement is thus such that on the one hand the nozzle assembly 20 can be moved with respect to the rail 18 in which case the sliding members 33, 34 move within the longitudinal slot 19 and that in addition on account of its mounting between the rollers 13 to 17, the rail 18 is able to slide horizontally within the support frame 9. In this way, the nozzle assembly 20 is able to travel laterally out of the support frame 9 in a double telescopic manner, as is illustrated in FIGS. 3 and 4.

Figure 2:
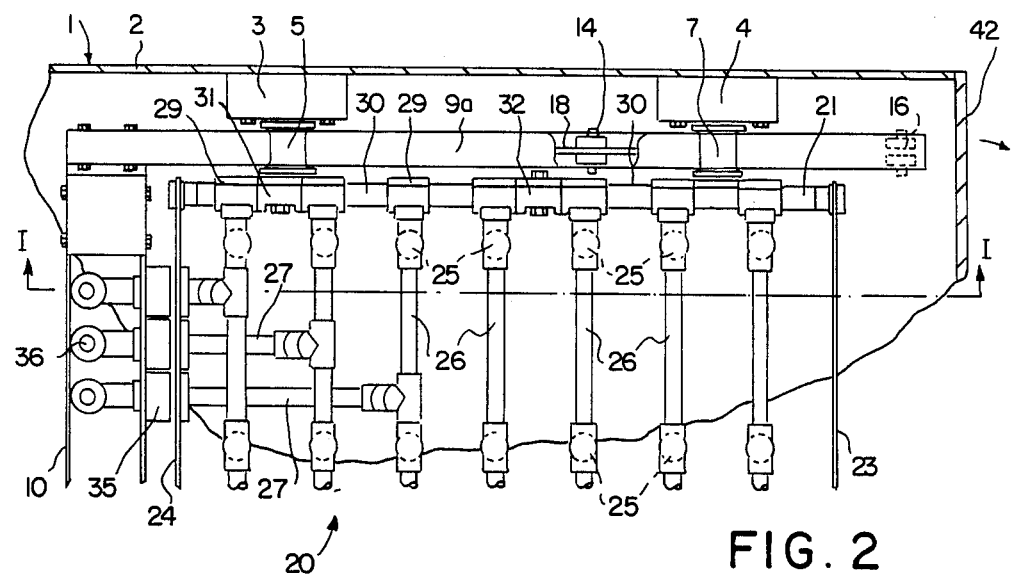
FIG. 2 is a plan view of the etching machine of FIG. 1, with the cover removed and the oscillation device removed.

In the inserted state of the nozzle assembly 20 illustrated in FIGS. 1 and 2, the plug-in coupling members 28, which are attached to the nozzle assembly 20, engage in complementary plug-in coupling members 35, which are located on the strut 10 of the support frame 9. The plug-in coupling members 35 are supplied with etching medium by way of pressure hoses which are not shown, which are attached to angle tubes 36 connected to the plug-in coupling members 35.

A geared motor 37 is mounted on the upwardly pointing wall 36 ("lid") of the etching machine. The output shaft 38 of the geared motor 37 passes in a sealed manner through the wall 36 and at its free end supports a cam disc 39. Two rollers 40, 41 screwed to the upper side of the horizontal leg 9a of the support frame 9 rest against diametrically opposed points on the outer periphery of the cam disc 39. The geared motor 37, cam disc 39 and rollers 40, 41 form an oscillating device, by which the nozzle assembly 20 can be set in a reciprocating motion.

Figure 5:
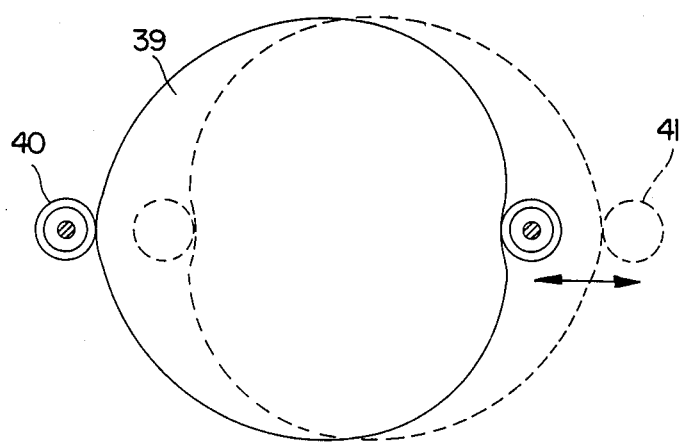
FIG. 5 is an underneath view of the cam disc, which is used in the oscillation device of the etching machine illustrated in FIGS. 1 to 4.

FIG. 5 is an underneath view of the cam disc 39 to an enlarged scale and indeed it is shown in two different rotary positions. The contour of the cam disc 39 is known in the machine construction as a so-called "cardioid". During the rotation of the cam disc 39, which is brought about by the geared motor 37, the rollers 40, 41 resting on opposing points of the cam disc experience a reciprocating movement (oscillating movement), which is transmitted to the frame 9 and thus to the entire nozzle assembly 20.

The method of operation of the afore-described etching machine is as follows:

During normal operation, the nozzle assembly 20 is located in the inserted position, which is shown in FIGS. 1 and 2. This means that the plug-in coupling members 28 located on the connecting strut 24 of the nozzle assembly 20 engage in the plug-in coupling members 35 located on the strut 10 of the support frame 9; etching medium may thus flow by way of the plug-in coupling members 35, 28 the connecting pipes 27 and the pipes 26 to the nozzles 25 and emerge from the latter in a desired etching pattern. The objects to be etched are conveyed below the nozzle assembly 20 shown in FIG. 1, at the same time above the second nozzle assembly located therebelow and which is not shown, perpendicular to the plane of the drawing of FIG. 1. The lateral opening 43 of the housing, through which the nozzle assembly 20 can be moved into its maintenance position, is closed-off by a side wall 42 which can be swung down.

Figure 6:
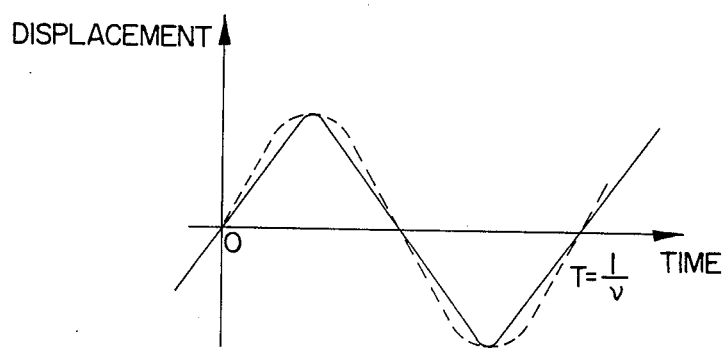
FIG. 6 is the displacement-time diagram of the oscillating movement of the nozzle assembly in the machine according to FIGS. 1 to 5.

The geared motor 37 sets the cam disc 39 in rotation. Due to the fact that the rollers 40 and 41 bear against the cam disc 39, the entire support frame 9 experiences an oscillating movement, the direction of which is at right angles to the conveying direction of the material to be etched. Irregularities in the spray pattern of the nozzles are compensated for by this oscillating movement, so that in the direction transverse to the conveying direction, there are thus no areas in which greater etching occurs than in other areas. Due to the construction of the cam disc 39 as a cardioid (see FIG. 5), the displacement-time diagram of the oscillating movement is substantially in the form of a saw-tooth, as shown in full line in FIG. 6. This means that the movement between the reversing points takes place at approximately constant speed, in which case at the reversing points themselves, a certain rounding-off of the displacement-time diagram is tolerated in order to avoid excessive acceleration forces. In FIG. 6, the displacement-time diagram of conventional crank drives for the oscillation movement is also shown in broken line, which is a sine curve. With this shape of the displacement-time diagram, an increased dwell period in the region of the maxima or minima of the sine curve occurs, so that at this point, despite the oscillatory movement of the nozzle assembly, etching is intensified. In view of the ever-increasing demands as regards uniform etching, considerable progress is achieved by the oscillation device operating with the cardioid as an eccentric.

If disturbances in the operation occur due to the fact that certain nozzles 25 become fouled and blocked or there is to be a change to a new material to be etched, the side wall 42 is folded down into the approximately horizontal position about an axis which extends parallel to the conveying direction on the lower longitudinal edge of the housing 1. In this way not only does it expose the side opening 43, in addition it simultaneously serves as a drip tray, in which etching medium dripping from the nozzle assembly 20 can be collected and can flow back into the etching medium sump.

The nozzle assembly 20 can now be drawn out laterally through the opening 43. In this case, first of all the sliding members 33, 34 move within the longitudinal slot 19 in the rail 18, until they abut against the end of the longitudinal slot 19. As the nozzle assembly 20 is drawn out further, the entire rail 18 now moves within the horizontal leg 9a of the support frame 9, in which case the rollers 12 to 17 ensure easy sliding and precise guidance. The nozzle assembly 20 finally arrives in the position illustrated in FIGS. 3 and 4 above the side wall 42 which is folded downwards. In this case, the individual nozzles 25 are easily accessible and can be easily removed, cleaned, re-aligned or replaced.

After the conclusion of the maintenance work, the nozzle assembly 20 is guided back into the position illustrated in FIGS. 1 and 2. The plug-in coupling members 28 engage in the plug-in coupling members 35, whereby the connection to the etching medium pump is produced. Finally, the nozzle assembly 20 is once again locked within the support frame 9 by a suitable device and the side wall 42 is folded up into its vertical position.

We claim:

1. In a machine for treating objects with a treatment liquid such as an etching medium which includes
a housing (1) having a side opening (43) which can be closed,
at least one nozzle assembly (20) which includes a plurality of nozzles and from which the treatment liquid is sprayed onto the objects to be treated, the improvement comprising that
(a) said nozzle assembly (20) is mounted within said housing so that it can be withdrawn in the manner of a drawer from a first working position within the housing (1) outwardly through said side opening (43) of the housing (1) to a second position in which it extends laterally outwardly from the interior of the housing (1) so that the nozzles (25) are easily accessible for inspection or maintenance, and
(b) cooperating plug-in coupling members (28, 35) are provided in said housing (1) and on said nozzle assembly (20) by which the nozzle assembly (20) is in a first position connected to a source of treatment liquid and in a second position is automatically disconnected from the source of treatment liquid when the nozzle assembly (20) is withdrawn outwardly through said side opening (43).

2. A machine according to claim 1 which includes a locking device, by which the nozzle assembly (20) can be fixed in its working position when in the housing (1).

3. A machine according to claim 1 wherein said side opening (43) can be closed off by a side wall which can be folded down into an approximately horizontal position, in which position it serves as a collecting tray for treatment liquid which drips from the nozzle assembly (20) located in its maintenance position.

4. A machine according to claim 1 wherein the nozzle assembly (20) includes a metal frame (21 to 24) which has torsional rigidity and which holds a plurality of nozzles (25).

5. A machine according to claim 4 wherein two opposite sides of said metal frame (21-24) comprises two support bars (21, 22) extending parallel to each other with a vertical spacing, said bars being connected to each other at their ends by connecting struts (23, 24).

6. A machine according to claim 5 wherein nozzles (25) are arranged in parallel rows and are supplied by way of a common pipe (26) said common pipe being held on the two pairs of support bars (21, 22).

7. A machine according to claim 6 wherein said pipe (26) has two ends and opposite ends of pipe (26) are held by sleeves (29), which are pushed onto the support bars (21, 22).

8. A machine according to claim 7 wherein tubular spacer members (30) are arranged between the sleeves (29) on the support bars (21, 22).

9. A machine according to claim 4 wherein projecting sliding members (33, 34) are attached on opposite sides of the metal frame (21 to 24), which sliding members are mounted to slide in a longitudinal slot (19) in a rail (18), which rail is in turn held in a sliding manner in the housing (1).

10. A machine according to claim 1 wherein the nozzle assembly (20) is mounted in a support frame (9), which carries out an oscillating movement together with the nozzle assembly, the nozzle assembly being mounted to slide laterally with respect to the support frame in the manner of a drawer between a working position and a maintenance position.

11. A machine according to claim 10 wherein said plug-in coupling members (35), which at the time of the extension of the nozzle assembly (20) into the maintenance position remain in place, are attached to the support frame (9) and connected by flexible pressure hoses to a source of treatment liquid.

12. A machine according to claim 11 wherein in side view the support frame (9) is in the shape of a horizontal U with two horizontal legs (9a) and a vertical connecting leg (9b), whereby in each case a nozzle assembly (20) is attached in a sliding manner to the horizontal legs (9a).

13. A machine according to claim 12 wherein the horizontal legs (9a) of the support frame (9) are each guided by two pairs of rollers (5 to 8) attached to the housing (1).

14. A machine according to claim 10 wherein in plan view the support frame (9) is in the shape of a U, the opening of the U pointing in the direction in which the nozzle assembly (2) is extended from the housing (1) for inspection or maintenance.

* * * * *